United States Patent
Eldridge et al.

(10) Patent No.: US 8,476,538 B2
(45) Date of Patent: Jul. 2, 2013

(54) WIRING SUBSTRATE WITH CUSTOMIZATION LAYERS

(75) Inventors: Benjamin N. Eldridge, Danville, CA (US); Gaetan L. Mathieu, Varennes (CA)

(73) Assignee: FormFactor, Inc., Livermore, CA (US)

( * ) Notice: Subject to any disclaimer, the term of this patent is extended or adjusted under 35 U.S.C. 154(b) by 402 days.

(21) Appl. No.: 12/719,136

(22) Filed: Mar. 8, 2010

(65) Prior Publication Data

US 2011/0214910 A1    Sep. 8, 2011

(51) Int. Cl.
*H05K 1/11* (2006.01)

(52) U.S. Cl.
USPC .................. 174/262; 174/261; 361/748

(58) Field of Classification Search
USPC .......... 361/748, 751, 728, 739, 746; 174/257, 174/258, 260–266
See application file for complete search history.

(56) References Cited

U.S. PATENT DOCUMENTS

| | | | |
|---|---|---|---|
| 4,771,537 A * | 9/1988 | Pryor et al. | 29/830 |
| 5,229,549 A * | 7/1993 | Yamakawa et al. | 174/262 |
| 5,310,965 A * | 5/1994 | Senba et al. | 174/250 |
| 5,371,654 A * | 12/1994 | Beaman et al. | 361/744 |
| 5,828,226 A | 10/1998 | Higgins | |
| 6,064,213 A | 5/2000 | Khandros et al. | |
| 6,275,051 B1 | 8/2001 | Bachelder | |
| 6,309,912 B1 | 10/2001 | Chiou et al. | |
| 6,334,247 B1 | 1/2002 | Beaman et al. | |
| 6,372,999 B1 | 4/2002 | Bjorndahl et al. | |
| 6,492,599 B1 * | 12/2002 | Sugihara | 174/258 |
| 6,729,019 B2 | 5/2004 | Grube et al. | |
| 6,739,879 B2 | 5/2004 | Sprietsma et al. | |
| 6,831,371 B1 | 12/2004 | Huemoeller et al. | |
| 6,857,880 B2 | 2/2005 | Ohtsuki et al. | |
| 6,864,105 B2 | 3/2005 | Grube et al. | |
| 6,920,689 B2 | 7/2005 | Khandros et al. | |

(Continued)

FOREIGN PATENT DOCUMENTS

EP    2109349    10/2009
KR    10-2009-0042841    4/2009

OTHER PUBLICATIONS

U.S. Appl. No. 12/264,751, filed Nov. 4, 2008, Eldridge.

(Continued)

*Primary Examiner* — Hoa C Nguyen
(74) *Attorney, Agent, or Firm* — Kirton McConkie

(57) ABSTRACT

One or more customization layers can be added to a wiring substrate. The customization layers can provide customized electrical connections from electrical contacts of the base wiring substrate to electrical contacts at an outer surface of the customization layers, which can allow the contacts at the outer surface of the customization layers can be in a different pattern than the contacts at the surface of the base wiring substrate. The customization layers can comprise electrically insulating material, electrically conductive via structures through the insulating material, electrically conductive traces, electrically conductive jumpers electrically connecting two traces without contacting a trace disposed between the two traces, and/or other such elements. A jumper can be formed by making a relatively small deposit of electrically insulating material between the two traces to be connected and then making a relatively small deposit of electrically conductive material on parts of the two traces and the insulating material. Via structures can be coupled to traces and an insulating material can be cast around the via structures. Alternatively, via structures can be formed in openings with sloped side walls in an insulating layer.

14 Claims, 10 Drawing Sheets

U.S. PATENT DOCUMENTS

| | | | |
|---|---|---|---|
| 7,024,763 B2 | 4/2006 | Mathieu et al. | |
| 7,047,638 B2 | 5/2006 | Eldridge et al. | |
| 7,242,083 B2 | 7/2007 | Yang | |
| 7,282,945 B1* | 10/2007 | Beaman et al. | 324/754.2 |
| 7,375,978 B2 | 5/2008 | Conner et al. | |
| 7,445,456 B2 | 11/2008 | Ishikawa | |
| 7,495,342 B2* | 2/2009 | Beaman et al. | 257/784 |
| 7,918,025 B2* | 4/2011 | Chu et al. | 29/890.04 |
| 7,982,945 B2* | 7/2011 | Tamaoki et al. | 359/341.1 |
| 2004/0000429 A1* | 1/2004 | Furusawa et al. | 174/264 |
| 2005/0108875 A1 | 5/2005 | Mathieu et al. | |
| 2005/0139390 A1* | 6/2005 | Kim et al. | 174/262 |
| 2006/0221544 A1* | 10/2006 | Lee | 361/303 |
| 2006/0283624 A1* | 12/2006 | Ok et al. | 174/151 |
| 2007/0074903 A1* | 4/2007 | Ide et al. | 174/262 |
| 2007/0152685 A1 | 7/2007 | Eldridge et al. | |
| 2008/0038941 A1 | 2/2008 | Bartholomew | |
| 2008/0074131 A1 | 3/2008 | Kim et al. | |
| 2010/0002359 A1* | 1/2010 | Lee et al. | 361/321.2 |
| 2010/0035375 A1* | 2/2010 | Grigoropoulos et al. | 438/99 |
| 2011/0094774 A1* | 4/2011 | Yang et al. | 174/254 |

OTHER PUBLICATIONS

"International Search Report," PCT/US2011/026960 (Nov. 29, 2011), 4 pages.

"International Preliminary Report on Patentability," PCT/US2022/026960 (Sep. 11, 2012), 6 pages.

* cited by examiner

WIRING SUBSTRATE WITH CUSTOMIZATION LAYERS

BACKGROUND

Some known wiring substrates provide electrical connections to electrical elements disposed in a particular pattern at an outer surface of the wiring substrate. An example of such a wiring substrate is a probe head, which can have electrically conductive probes disposed in a particular pattern on an outer surface of the probe head and internal wiring to the probes. Embodiments of the invention include a process of adding customization layers to a standard base wiring substrate that provide customized electrical connections to custom placed electrical elements such as probes at an outer surface of the customization layers. Such a process can allow a base wiring substrate with contacts that are not disposed in a desired pattern to be customized to have electrical elements such as probes disposed in a desired pattern that is different than the pattern of the contacts on the base wiring substrate.

SUMMARY

In some embodiments of the invention, an electrical jumper in a multi-layer wiring substrate can be made by obtaining a base substrate, which can include customization layers on a surface of the base substrate. The customization layers can include a layer of electrically conductive traces on an outer surface of a first layer of electrically insulating material. The layer of traces can include a first trace, a second trace, and a third trace. A portion of the third trace can be in a space between ends of the first trace and the second trace. The process can also include printing in the space between the ends of the first trace and the second trace and on the portion of the third trace an electrically insulating substance, and the process can further include forming an electrical jumper that electrically connects the first trace and the second trace without electrically contacting the third trace. The electrical jumper can be formed by printing an electrically conductive substance onto the end of the first trace, the insulting substance, and the end of the second trace.

In some embodiments of the invention, a multi-layer wiring substrate can include a base substrate and customization layers on a surface of the base substrate. The customization layers can include a first layer of electrically insulating material, and a first layer of electrically conductive traces on a surface of the first layer of insulating material. The first layer of traces can include a first trace, a second trace, and a third trace, and a portion of the third trace can be in a space between ends of the first trace and the second trace. The customization layers can also include an electrically insulating substance comprising a dried printable electrically insulating material on the portion of the third trace and in the space between the ends of the first trace and the second trace. The customization layers can also include an electrically conductive jumper, which can comprise an electrically conductive substance comprising a dried printable electrically conductive material on the ends of the first trace and the second trace and the insulating substance. The jumper can electrically connect the first trace and the second trace without electrically contacting the third trace.

In some embodiments of the invention, a multi-layer wiring substrate can be made by a process that includes forming electrically conductive first via structures coupled to and extending from electrically conductive traces in a first layer of electrically conductive traces on a surface of a base substrate. The process can also include forming a rigid first layer of electrically insulating material coupled to the surface of the base substrate and in which the first via structures are embedded. The rigid first layer of electrically insulating material can be formed by casting the first layer of electrically insulating material around the first via structures and on the first layer of traces and the surface of the base substrate. The first via structures can provide electrical connections from the traces in the first layer of traces to an outer surface of the first layer of insulating material.

In some embodiments of the invention, a multi-layer wiring substrate can include a base substrate and a first layer of electrically conductive traces on a surface of the base substrate. The wiring substrate can also include a first rigid layer of electrically insulating material on the first layer of traces and coupled to the surface of the base substrate, and the wiring substrate can further include electrically conductive first vias embedded in the first layer of insulating material. Each of the first vias can comprise a stack of wire studs or a wire bonded to one of the traces of the first layer of traces and extending to an outer surface of the first layer of insulating material.

In some embodiments of the invention, an electrical connection in a multi-layer wiring substrate can be made by a process that includes obtaining a base substrate comprising a plurality of customization layers on a surface of the base substrate. The customization layers can include first traces in a first layer of electrically conductive traces, a first layer of electrically insulating material covering the first layer of electrically conductive traces, and second traces in a second layer of electrically conductive traces on an outer surface of the first layer of insulating material. The process can also include creating in the first layer of electrically insulating material a first opening to a portion of one of the first traces. The first opening can be larger at the outer surface of first insulating material than at the one of the first traces, and a sidewall of the first opening can slope from the outer surface of the first insulating material to the one of the first traces. The process can also include forming a first electrical connector electrically connecting one of the second traces and the one of the first trace. The first electrical connector can be formed by printing an electrically conductive substance on portions of the one of the second traces, the sidewall of the first opening, and the one of the first traces.

DETAILED DESCRIPTION OF EXEMPLARY EMBODIMENTS

Figure 1:
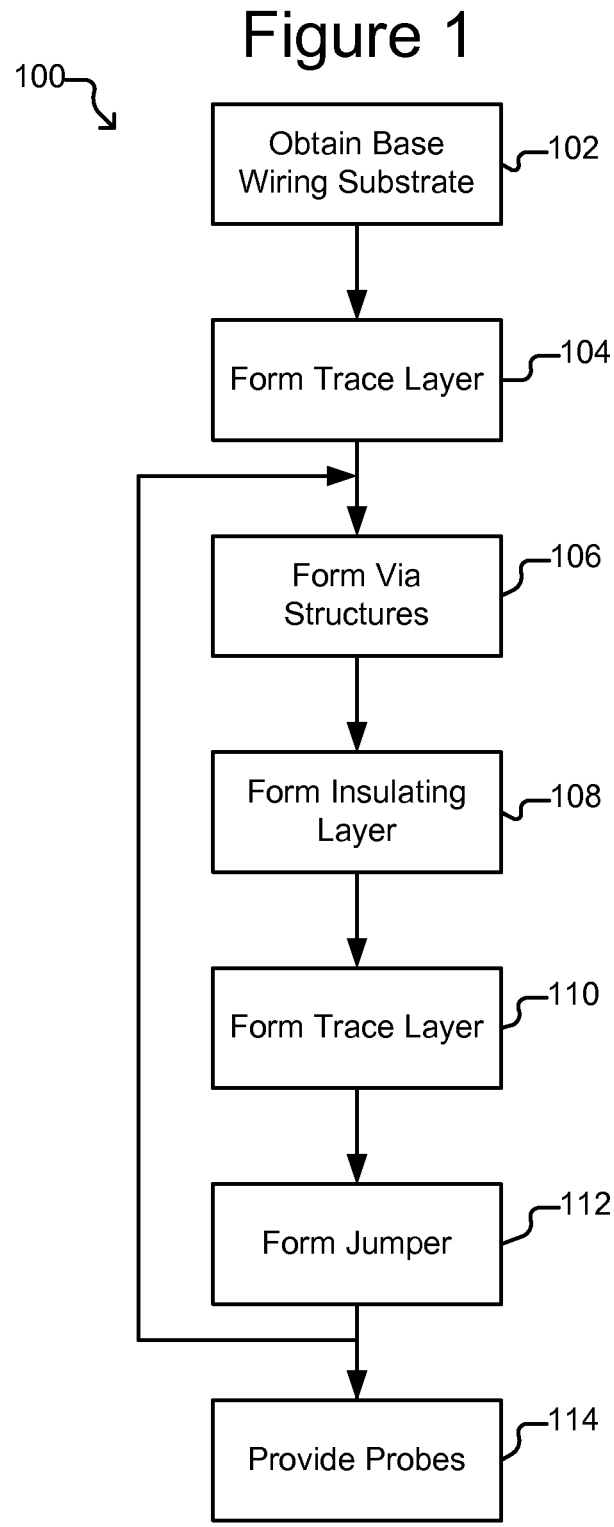
FIG. 1 illustrates an example of a process for adding customization layers to a base wiring substrate to make a customized, multi-layer circuit substrate according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Some embodiments of the invention can be a process of customizing a base wiring substrate comprising a predefined pattern of electrical contacts at a surface of the base wiring substrate, and some embodiments of the invention can be to the customized base wiring substrate. The process can comprise adding one or more customization layers to the surface of the wiring substrate that provide customized electrical connections from the contacts at the surface of the base wiring substrate to electrical contacts (e.g., probes) at an outer surface of the customization layers. The contacts at the outer surface of the customization layers can be in a different pattern than the contacts at the surface of the base wiring substrate. The customization layers can comprise electrically insulating material, electrically conductive via structures, electrically conductive traces, electrically conductive jumpers electrically connecting two traces without contacting a trace disposed between the two traces, and/or other such elements. In some embodiments, the process can include forming such jumpers by making a relatively small deposit of electrically insulating material between the two traces to be connected and then making a relatively small deposit of electrically conductive material on parts of the two traces and the insulating material. In some embodiments, the process can also include forming a layer of insulating material with via structures extending through the insulating layer by coupling the via structures to traces and then casting a layer of insulating material around the via structures. In other some embodiments, via structures can be formed by deposing an electrically conductive substance on sloped-side wall openings in a layer of insulating material that exposes a trace under the insulating material.

FIG. 1 illustrates a process 100 for adding one or more customization layers to a base wiring substrate and thereby making a multi-layered wiring substrate that comprises the base substrate and one or more customization layers according to some embodiments of the invention. For ease of illustration and discussion, the process 100 is discussed below with respect to an example illustrated in FIGS. 2-10 in which customization layers are added to a base wiring substrate 202. The process 100 is not, however, limited to the examples illustrated in FIGS. 2-10.

Figure 2:
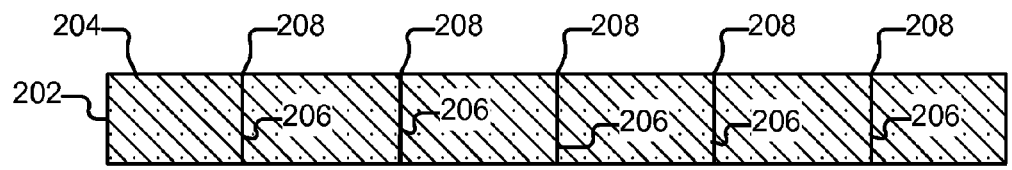
FIG. 2 illustrates an example of a base wiring substrate according to some embodiments of the invention.

Referring to FIG. 1, at step 102, a base wiring substrate (which can be an example of a base substrate) can be obtained at 102 of the process 100. FIG. 2 illustrates an example of such a base wiring substrate 202, which can be any rigid or semi-rigid substrate structure with electrically conductive contacts 208 at or on a surface 204 of the substrate. In some embodiments, the base wiring substrate 202 can comprise a printed circuit board or a ceramic material. As illustrated in FIG. 2, the contacts 208 can be ends of electrically conductive vias 206 through the wiring substrate 202. Alternatively, the contacts 208 can be terminals, pads, traces, or other such electrically conductive structures (not shown) on the surface 204 of the wiring substrate 202. Although five vias 206 and contacts 208 are shown, there can be more or fewer. Also, the vias 206 need not be entirely vertical but can include horizontal components (not shown).

Figure 3:
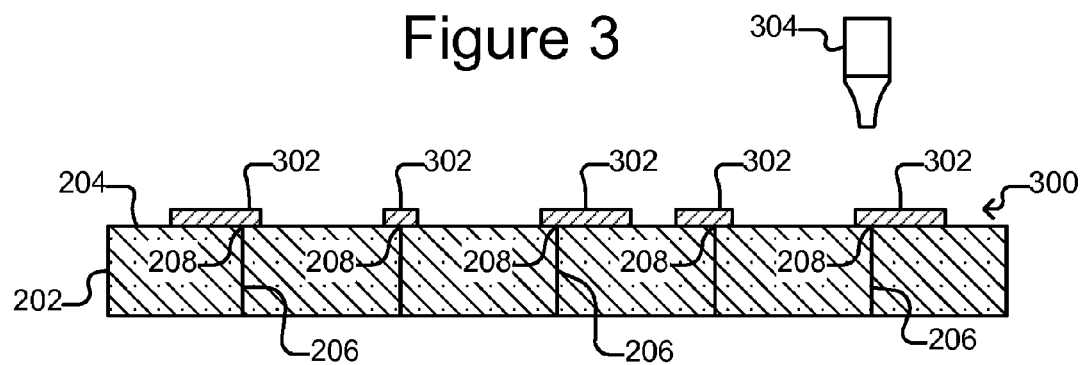
FIG. 3 illustrates a layer of traces on the wiring substrate of FIG. 2 according to some embodiments of the invention.

After obtaining the base wiring substrate at step 102 of the process 100 of FIG. 1, at step 104, a layer of electrically conductive traces can be formed on the surface of the wiring substrate. FIG. 3 illustrates an example in which a layer 300 of traces 302 (layer 300 can be termed a "trace layer") can be formed on the surface 204 of the wiring substrate 202. The trace layer 300 can be an example of a customization layer (e.g., a first, second, third, etc. customization layer or a first, second, third, etc. trace layer). As used herein, the term "trace" includes an elongate structure as well as a terminal or pad or similar such structure that need not be elongate. The traces 302 can thus be different sizes, shapes, etc. Each of the traces 302 can be formed on and thus electrically connected to one of the contacts 208 on the surface 204 of the wiring substrate 202 as illustrated in FIG. 3. Some or all of the traces 302 can extend to locations where, as will be seen, a via structure (e.g., 402 in FIG. 4) is to be made to connect a trace 302 to a layer (e.g., 700 in FIG. 7) of traces (e.g., 702, 704, 706, and/or 708 in FIG. 7) to be formed above the layer 300 of traces 302.

The traces 302 can be formed in any manner suitable for forming electrically conductive traces. In some embodiments, the traces 302 can be formed by dispensing a fluid or printable electrically conductive material on the surface 204 of the wiring substrate 202. For example, such material can be dispensed through a dispenser 304, which can be moved about the surface 204 and thus deposit such traces 302 in desired locations on the surface 204 of the wiring substrate 202. In some embodiments, the dispenser 304 can be a print head such as an ink jet print head (e.g., an aerosol jetting mechanism). In other embodiments, the dispenser 304 can be other types of dispensers. For example, the dispenser 304 can be a pipette that comprises a relatively small tube that can be filled with trace material, which can be deposited on the surface 204 of the wiring substrate 202 as the pipette is dragged along the surface 204. Regardless of the type of dispenser 304, the traces 302 can comprise a material that can be deposited through a dispenser 304 in fluid form and then dried or cured to form electrically conductive traces 302. For example, the material of the traces 302 can be an ink material in which is suspended electrically conductive particles (e.g., particles or nanoparticles of silver, gold, copper, or the like). Such an ink material can be deposited by the dispenser 304 while in a liquid, viscous, or aerosol state, and can then be dried on the surface 204 of the wiring substrate 202. Dispenser 304, however, need not be used. For example, in some embodiments, the traces 302 can be formed on the surface 204 of the wiring substrate 202 by techniques that do not use a dispenser. Such techniques can include electroplating, chemical vapor deposition, sputtering, and the like. In such cases, the traces 302 can comprise an electrically conductive metal (e.g., silver, gold, copper, or the like).

The number, shape, sizes, and locations of the traces 302 in FIG. 3 are examples only and can thus be different than illustrated in FIG. 3. For example, although five traces 302 are shown, there can be more or fewer. As another example, there need not be a trace 302 for every contact 208. It is noted that the base wiring substrate 202 can alternatively be obtained at step 102 of the process 100 of FIG. 1 with the trace layer 300 and traces 302 already on the surface 204 of the wiring substrate 202. Step 104, among other steps, can be optional at least for this reason.

Figure 4:
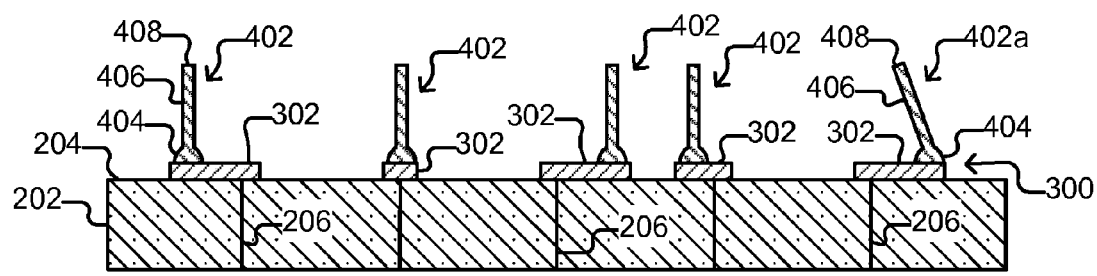
FIG. 4 illustrates via structures coupled to the traces of FIG. 3 according to some embodiments of the invention.

At step 106 of the process 100 of FIG. 1, electrically conductive via structures can be formed on one or more of the traces. FIG. 4 illustrates an example in which via structures 402 (which can be examples of first, second, etc. via structures) are formed on the traces 302. As will be seen, the via structures 402 can provide electrical connections between one or more of the traces 302 and the traces 702 in another layer 700 of traces (see FIG. 7) to be formed above the traces 302. Each via structure 402 can be coupled at a proximal end 404 to one of the traces 302 and extend to a distal end 408 that is located approximately where the via structure 402 is to contact one of the traces 702 (see FIG. 7). As shown in FIG. 4, each via structure 402 can be oriented generally or approximately perpendicularly (from the proximal end 404 to the distal end 408) with respect to the surface 204 of the wiring substrate 402. Alternatively, a body 406 (between the proximal end 404 and the distal end 408) of one or more of the via structures 402 can be angled with respect to the surface 204 of the wiring substrate 402 such that the distal end 408 is off set from the proximal end 404 in a direction that is parallel with the surface 204 of the wiring substrate 202. The angle between the surface 204 of the wiring substrate 202 and the body 406 can be any angle between zero and ninety degrees including with limitation: 15-89 degrees, 25-89 degrees, 30-89 degrees, 45-89 degrees, 60-89 degrees, and/or 75-89 degrees; and/or greater than or equal to 20, 30, 45, 60, 75, 80, 85 degrees. (The foregoing numerical angle values are examples only, and the invention is not necessarily limited to any of these numerical angle values.) The via structure 402a in FIG. 4 is an example of a via structure with a body 406 that is angled at other than approximately 90 degrees with the surface 204 of the wiring substrate 202. Although one such via structure 402a is shown in FIG. 4, there can be more or fewer. Moreover, the body 406 may extend in any direction from the surface 204 of the wiring substrate 202.

Figure 5:
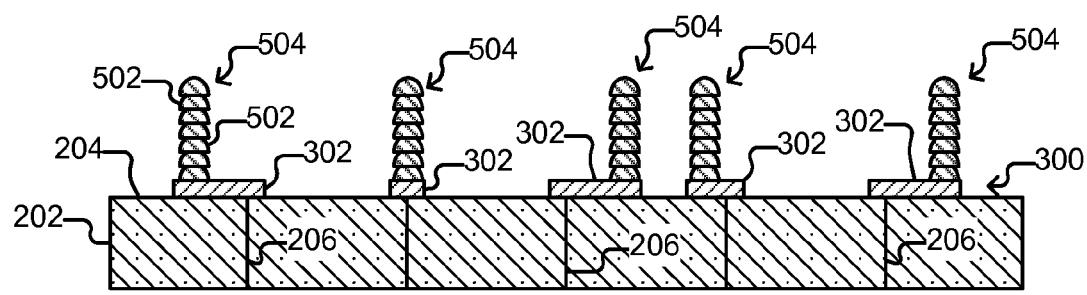
FIG. 5 illustrates via structures that comprise stacks of wire studs according to some embodiments of the invention.

In the example shown in FIG. 4, the via structures 402 can be electrically conductive wires that are bonded (e.g., using wire bonding techniques such as are known in the semiconductor industry) at their proximal ends 404 to the traces 302. For example, using standard wire bonding techniques, a wire can be bonded to a trace 302, paid out, and then severed, forming a via structure 402. The via structures 402, however, need not be wires. FIG. 5 illustrates another example of the via structures 402. In FIG. 5, a via structure 402 can comprise a stack 504 of wire studs 502. For example, a wire can be bonded to a trace 302 and immediately severed, leaving substantially only a wire stud 502 coupled to the trace 302. Thereafter, a wire can be bonded to the wire stud 502 and immediately severed, leaving a second wire stud 502 coupled to the wire stud 502 coupled to the trace 302. The foregoing can be repeated as desired to create a stack 504 of wire studs 502 coupled to a trace 302, and the stack 504 of wire studs 502 can be a via structure 402 in FIG. 4 (and can thus replace a via structure 402 in FIG. 4).

The number, shape, sizes, and locations of the via structures 402 in FIG. 4 (whether implemented as wires as illustrated in FIG. 4, stacks 504 of wire studs 502 as illustrated in FIG. 5, or in some other way) are examples only and can thus be different than illustrated in FIG. 4. For example, although five via structures 402 are shown in FIG. 4, there can be more or fewer. As another example, there need not be a via structure 402 coupled to every trace 302. As yet another example, there can be more than one via structure 402 coupled to a trace 302.

Figure 6:
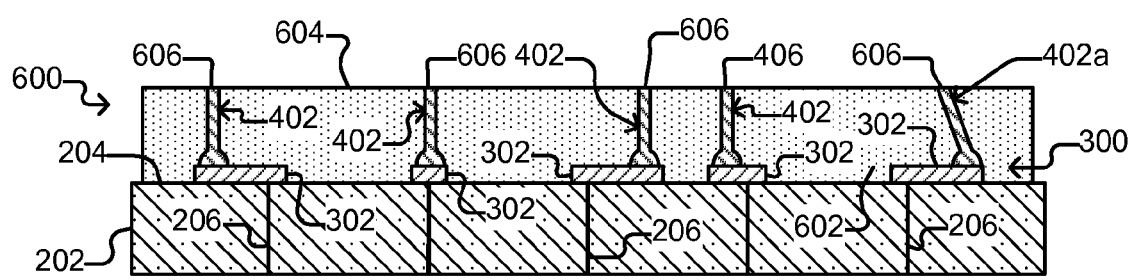
FIG. 6 illustrates a layer of insulating material surrounding the via structures according to some embodiments of the invention.

Returning again to the process 100 of FIG. 1, at step 108, an electrically insulating layer can be formed around the via structures. FIG. 6 illustrates an example in which an insulating layer 600 can be formed on the surface 204 of the wiring substrate 202 and the traces 302 and around the via structures 402. The insulating layer 600 can comprise an electrically insulating material 602 and can be an example of a customization layer (e.g., a first, second, third, etc. customization layer or a first, second, third, etc. insulating layer).

In some embodiments, the material 602 of the insulating layer 600 can be cast around the via structures 402. For example, dam or mold structures (not shown) can be disposed about the periphery of the surface 204 of the wiring substrate 202, and the insulating material 602 can be deposited within the dam or mold structures (not shown) and around the via structures 402 as generally shown in FIG. 6. For example, the insulating material 602 can be deposited while in a viscous state onto the surface 204 of the wiring substrate 402 and the traces 302 and around the via structures 402. In some embodiments, the insulating material 602 can be dispensed through a syringe or other dispensing mechanism. In other embodiments, the insulating material can be poured onto the surface 204 of the wiring substrate 202 and the traces 302. Care can be taken to avoid damaging the via structures 402.

After the insulating material 602 is deposited onto the surface 204 of the wiring substrate 202 and the traces 302 and around the via structures 402, the insulating material 602 can be cured or otherwise hardened. In some embodiments, the insulating material 602 can be exposed to curing heat, radiation (e.g., ultraviolet radiation), ambient air, or the like to harden the insulating material 602. In other embodiments, the insulating material 602 can be a material that is viscous at an elevated temperature and hardened at room temperature. If such insulating material 602 is used, the insulating material 602 can be heated before being deposited onto the wiring substrate 202 and around the via structures 402 (or alternatively the wiring substrate 202 can be heated) sufficiently to put the insulating material 602 into a viscous state. Then, after the insulating material 602 is deposited on the wiring substrate 202 and around the via structures 402, the insulating material 602 can be allowed to cool and thus harden.

Regardless, after insulating material 602 has hardened, an outer surface 604 of the insulating layer 600 can be planarized (which can involve removing portions of the insulating material 600 and/or distal ends 408 of the via structures 402). In this way, the thickness of the insulating layer 600 and/or the lengths of the via structures 402 can be controlled. As shown, new distal ends 606 of the via structures 402 can be located at the surface 604 of the insulating layer 600.

The insulating material 602 can be any material that is suitable for casting on the wiring substrate 202 and around the via structures 402. In some embodiments, one or more of the following properties can be considered in selecting a suitable insulating material 602: the coefficient of thermal expansion of the insulating material 602 when hardened; the temperature at which the hardened insulating material 602 reflows; the strength, stiffness, and/or hardness of the hardened insulating material 602; and/or the like. In some embodiments, the insulating material 602 can comprise an epoxy. For example, the insulating material 602 can comprise an electrically insulating material (e.g., a novolac epoxy) mixed with silica (quartz) powder. For example, in some embodiments, the insulating material 602 can comprise silica particles in a concentration of fifty percent to ninety percent by weight in an electrically insulating material such as novolac epoxy. The foregoing examples including the specified numerical ranges are examples only; the insulating material 602 can comprise other materials and/or other concentrations of silica or another such material in an insulating material.

Figure 7:
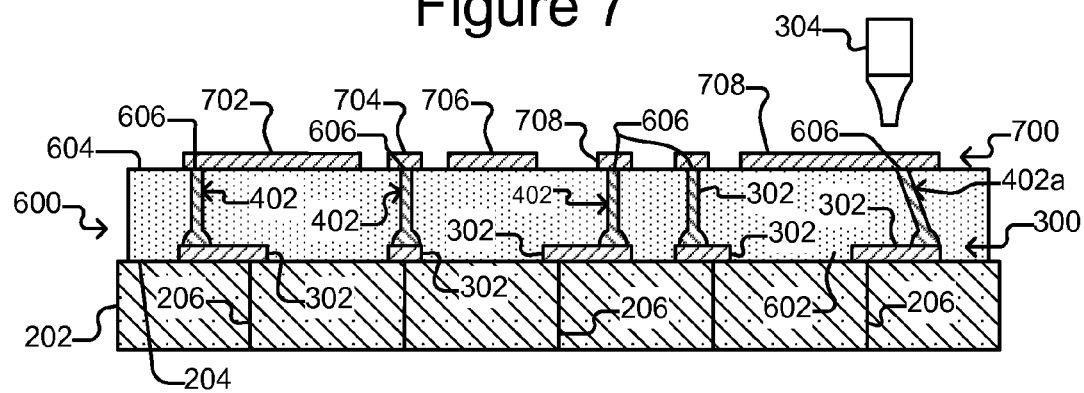
FIG. 7 illustrates a layer of traces on the insulating layer of FIG. 6 according to some embodiments of the invention.

Referring again to the process 100 of FIG. 1, at step 110, another layer of electrically conductive traces can be formed on the outer surface the insulating layer. FIG. 7 illustrates an example in which a trace layer 700 comprising electrically conductive traces 702, 704, 706, and/or 708 can be formed on the outer surface 604 of the insulating layer 600. The trace layer 700 can be an example of a customization layer (e.g., a first, second, third, etc. customization layer or a first, second, third, etc. trace layer), and each of the traces 702, 704, 706, and/or 708 can be an example of a first, second, third, fourth, etc. trace. Each of the traces 702, 704, 706, and/or 708 can be formed on and thus electrically connected to the distal end 606 of one or more of the via structures 402 as illustrated in FIG. 7. Some or all of the traces 702, 704, 706, and/or 708 can extend to locations where, as will be seen, electrically conductive probes (or other electrically conductive contact structures) (e.g., probes 904 in FIG. 9) are to be provided or via structures (e.g., 1012 in FIG. 10) are to be coupled to the traces 702, 704, 706, and/or 708. The traces 702, 704, 706, and/or 708 can be generally the same as and can be made in the same way and of the same material or materials as the traces 302 as discussed above. For example, the traces 702, 704, 706, and/or 708 can comprise any of the materials identified above as possible materials for the traces 302, and the traces 702, 704, 706, and/or 708 can be made in any of the ways identified above for making the traces 302.

Figure 8:
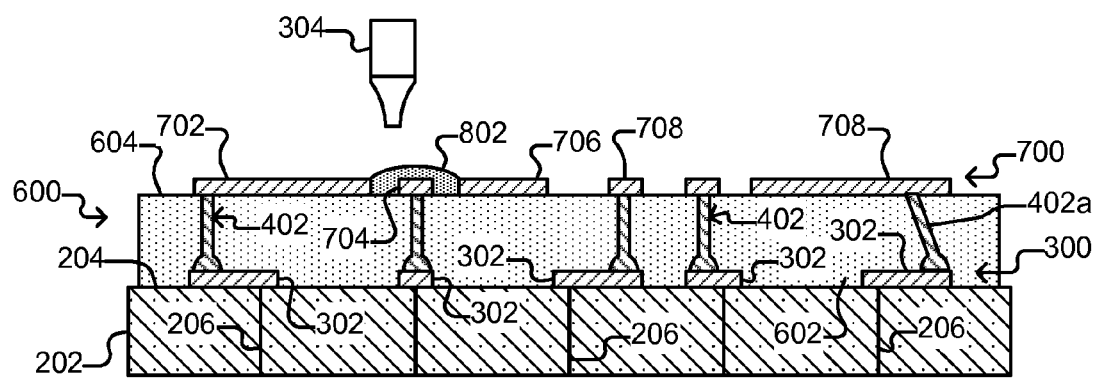
FIGS. 8 and 9 illustrate formation of a electrical jumper on the traces of FIG. 7 according to some embodiments of the invention.
Figure 9:
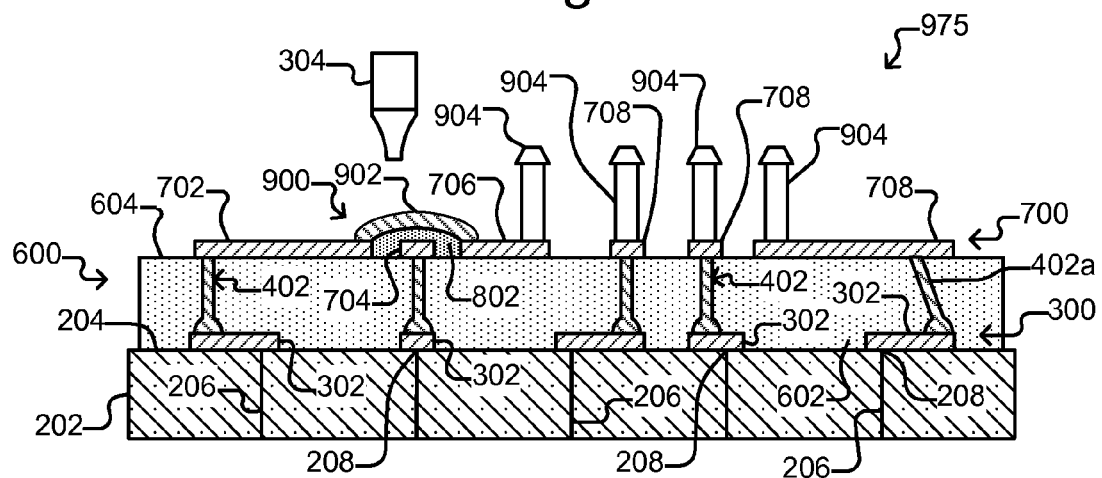

Referring again to the process 100 of FIG. 1, at step 112 an electrically conductive jumper can be formed that electrically connects two or more of the traces without electrically connecting to a trace disposed between the two or more traces. FIGS. 8 and 9 illustrate an example in which an electrically conductive jumper 900 can be formed. In the example illustrated in FIGS. 8 and 9, traces 702 and 706 can be electrically connected by the jumper 900 without electrically connecting to the trace 704. The foregoing, however, is an example only, and a jumper like jumper 900 can be formed to connect other traces in the trace layer 700. Also, although one jumper 900 is shown in FIGS. 8 and 9, more than one such jumper 900 can be formed.

As shown in FIG. 8, an insulating substance 802 can be deposited onto the surface 604 of the insulating layer 600 between the traces 702 and 706 (e.g., between ends of the traces 702 and 706) that are to be electrically connected. As also shown, the insulating substance 802 can also be deposited onto a portion of the trace 704 to which the jumper 900 is not to be electrically connected and thus is to bypass electrically. Although the insulating substance 802 can generally fill at least a portion of the space between the traces 702 and 706 to be electrically connected, the insulating substance 802 need not do so. Rather, in some embodiments, it is sufficient that the insulating substance 802 covers enough of the trace 704 that an electrically conductive material (902 in FIG. 9) can be deposited onto portions of the traces 702 and 706 and the insulating substance 802 without contacting the trace 704.

The insulating substance 802 can be deposited in any manner suitable for depositing an electrically insulating material on a substrate. In some embodiments, the insulating substance 802 can be deposited as a fluid or otherwise printable material. For example, the insulating substance 802 can be dispensed through the dispenser 304 (which is discussed above with respect to FIG. 3). The insulating substance 802 can comprise a material that can be deposited through the dispenser 304 in a liquid, viscous, or aerosol state and then dried or cured into a generally solid state. For example, the insulating substance 802 can be an ink material. Regardless of whether the insulating substance 802 is an ink material, the insulating substance 802 can be dried or cured in any manner appropriate to the particular material. For example, the insulating substance 802 can be dried or cured by exposure to ambient air and temperature or by exposure to heat or a source of curing energy. In some embodiments, the insulating substance 802 can be deposited by techniques other than the use of the dispenser 304. Such techniques can include depositing the insulating substance 802 by spin coating or with an applicator such as a brush, a spatula, or the like.

As shown in FIG. 9, an electrically conductive substance 902 can be deposited onto portions (e.g., ends) of the traces 702 and 706 that are to be electrically connected. As also shown, the conductive substance 902 can also be deposited onto the insulating substance 802 such that the conductive substance 902 electrically connects the traces 702 and 706 without contacting or otherwise electrically connecting to the trace 704 disposed at least in part between the traces 702 and 706. The deposit of conductive substance 902 can be generally the same as and can be made in the same way and of the same material or materials as the traces 302 as discussed above. For example, the conductive substance 902 can comprise any of the materials identified above as possible materials for the traces 302, and the conductive substance 902 can be deposited in any of the ways identified above for making the traces 302. For example, the conductive substance 902 can comprise an ink or other material in which is suspended electrically conductive particles (e.g., particles or nanoparticles of silver, gold, copper, or the like), and the conductive substance 902 can be deposited onto the traces 702 and 704 and the insulating substance 802 through the dispenser 304 (e.g., a print head such as an ink jet print head or an aerosol jetting mechanism) in a liquid, viscous, or aerosol state and then dried or otherwise cured.

As mentioned, the jumper 900 can be a simple, fast, and/or efficient way of electrically connecting at least two traces (e.g., traces 702 and 706) in the trace layer 700 without electrically connecting a trace (e.g., 704) disposed between the at least two traces. As noted above, there can be more than one of such jumpers 900 electrically connecting other traces in the trace layer 700. Such jumpers 900 can provide for electrical connections between traces (e.g., 702 and 706) in the same trace layer (e.g., 700) without the need for an additional layer of insulating material (e.g., like 600) and via structures (e.g., like 402) to connect electrically traces in the trace layer.

Although not shown in FIG. 3-10, one or more jumpers like jumper 900 can be formed on the surface 204 of the wiring substrate 202 to electrically connect two or more of the traces 302 without electrically connecting to one of the traces 302 between the two or more traces 302. Thus, the step 112 can also be performed following the step 104 in the process 100 of FIG. 1.

Figure 10:
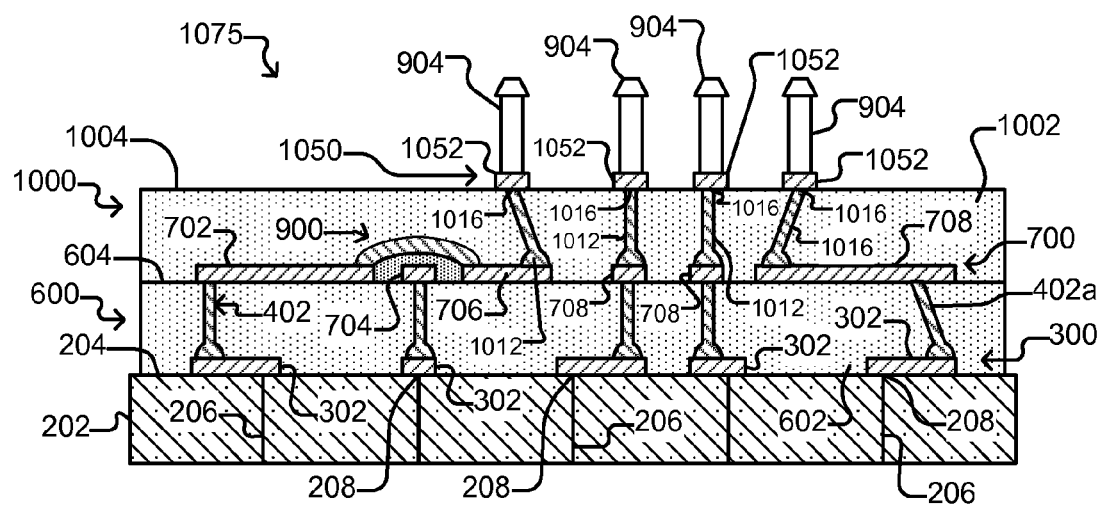
FIG. 10 illustrates another layer of insulating material and layer of traces according to some embodiments of the invention.

Referring again to the process 100 of FIG. 1, as shown, one or more of steps 106-112 can be repeated before providing probes at step 114. FIG. 10 illustrates an example in which one or more of steps 106-112 can be repeated to form additional customization layers comprising insulating layer 1000 (which can be an example of a first, second, third, etc. customization layer or a first, second, third, etc. insulating layer) in which via structures 1012 (which can be examples of first, second, etc. via structures) are embedded and a trace layer 1050 of electrically conductive traces 1052 on a surface 1004 of the insulating layer 1000. (The layer 1050 of traces 1052 can be an example of a customization layer (e.g., a first, second, third, etc. customization layer or a first, second, third, etc. trace layer).)

As shown in FIG. 10, the via structures 1012 can be coupled to ones of the traces 702, 704, 706, and/or 708 at step 106. The via structures 1012 can be like and can be formed in the same manner as the via structures 402. For example, the via structures 1012 can comprise bonded wires like the via structures 402 can be bonded wires as discussed above. As another example, the via structures 1012 can comprise stacks of wire studs like the stacks 504 of wire studs 502 shown in and discussed above with respect to FIG. 5. As illustrated in FIG. 10, one or more of the via structures 1012 can be angled with respect to the surface 604 of the insulating layer 600 in generally the same way as via structure 402a is angled with respect to the surface 204 of the wiring substrate 202.

The insulating layer 1000 can comprise an electrically insulating material 1002, which can be like the insulating material 602. For example, the insulating material 1002 can comprise any of the materials discussed above with respect to the insulating material 602. Likewise, the insulating material 1002 can be deposited or otherwise formed on the surface 604, the trace layer 700, and the jumper 900 in any of the ways discussed above in which the insulating material 602 can be deposited or otherwise formed on the surface 204 of the wiring substrate 202. Generally in the same way in which distal ends 606 of the via structures 402 are located at the surface 602 of the insulating material layer 600 as discussed above with respect to FIG. 6, distal ends 1016 of the via structures 1012 can be located at an outer surface 1004 of the insulating layer 1000, and the traces 1052 of the trace layer 1050 can be electrically connected to the distal ends 1016 in the same way that the traces 702, 704, 706, and/or 708 of trace layer 700 are electrically connected to distal ends 606 of the via structures 402. (It is noted that the outer surface 1004 of the insulating layer 1000 can be planarized in the same way that the outer surface 604 of the insulating layer 600 is planarized as discussed above.) The traces 1052 of the trace layer 1050 can be generally the same as and can be made in the same way and of the same material or materials as the traces 302 as discussed above. For example, the traces 1052 can comprise any of the materials identified above as possible materials for the traces 302, and the traces 1052 can be made in any of the ways identified above for making the traces 302. Although not shown in FIG. 10, one or more jumpers like jumper 900 can be formed on the surface 1004 of the insulating layer 1000 to electrically connect two or more of the traces 1052 without electrically connecting to one of the traces 1052 between the two or more traces 1052 connected by the jumper (not shown).

Referring to the process 100 of FIG. 1 again, after one or more of the steps 106-112 have been repeated as many times as desired (which can be zero to as many times as needed or desired), at step 114, electrically conductive contact structures (e.g., probes 904) can be coupled to and/or formed on one or more of the traces 702, 704, 706, and/or 708 in the trace layer 700. FIG. 9 illustrates an example in which the steps 106-112 are performed one time and the step 114 is performed to couple probes 904 to one or more of the traces 702, 704, 706, and/or 708. FIG. 10 illustrates an example in which some or all of the steps 106-112 are performed two times and then step 114 is performed to couple probes 904 to one or more of the traces 1052. Regardless of whether coupled to the traces 702, 704, 706, and/or 708 or to the traces 1052, the probes 904 can be for making pressure based electrical connections with terminals (not shown) of an electronic device (not shown). In such a case, the probes 904 can be disposed in a pattern on the traces 702, 704, 706, and/or 708 or the traces 1052 that corresponds to the terminals (not shown) to be contacted. The probes 904 can be electrically conductive spring probes, posts, bumps, or the like. Although four probes 904 are illustrated in FIGS. 9 and 10, more or fewer probes 904 can be used. Moreover, the size, shape, and pattern of the probes 904 in FIGS. 9 and 10 are examples only, and the probes 904 can be different sizes and/or shapes and/or disposed in different patterns than shown in FIG. 9 or FIG. 10.

In some embodiments, the process 100 of FIG. 1 can produce a multi-layer wiring substrate such as a probe head in which customization layers on a base wiring substrate provide customized electrical connections to custom placed probes. The probe head 975 of FIG. 9 can be an example of such a probe head. The trace layer 300, the insulating layer 600, the trace layer 700, and/or the jumper 900 can be examples of customization layers that provide electrical connections (combinations of electrically connected traces 302, a via structures 402, traces 702, 704, 706, and/or 708, and/or jumper 900) from the contacts 208 of the base wiring substrate 202 to custom placed probes 904. It is noted that the probes 904 can be in a pattern that is different than the pattern of contacts 208 to which the probes 904 are electrically connected.

The probe head 1075 of FIG. 10 can be another example of such a probe head. The trace layer 300, the insulating layer 600, the trace layer 700, the insulating layer 1000, the jumper 900, and/or the trace layer 1050 can be examples of customization layers that provide electrical connections (combinations of electrically connected traces 302, a via structures 402, traces 702, 704, 706, and/or 708, jumper 900, via structures 1012, and/or traces 1052) from contacts 208 of the base wiring substrate 202 to custom placed probes 904. It is again noted that the probes 904 can be in a pattern that is different than the pattern of contacts 208 to which the probes 904 are electrically connected.

As will be seen, probe heads 975 and 1075 can be examples of probe heads that can be part of a probe card assembly like the probe card assembly 1814 in FIGS. 18 and 19 (which are discussed below). The probe heads 975 and 1075 of FIGS. 9 and 10 are examples only, and other types of electronic devices can be made using the process 100 of FIG. 1. For example, step 114, among other steps, of the process 100 of FIG. 1 can be optional and need not be performed and/or can be replaced with another step. For example, step 114 need not be performed, and probes 904 consequently need not be coupled to any trace or even present. As another example, rather than coupling probes 904 to traces at step 114, another type of electronic structure or structures can be coupled to the traces. For example, electronic circuit elements (not shown) such as resistors, capacitors, transistors, or the like can be coupled to the traces (e.g., traces 702, 704, 706, and/or 708 or 1052). In some embodiments, for example, resistors (not shown) can be coupled to a trace 702, 704, 706, and/or 708 or 1052 such that a resistor (not shown) electrically connects the trace to ground. As another example, a resistor (not shown) can be coupled to a trace 702, 704, 706, and/or 708 or 1052 and a probe 904 coupled to the trace such that the resistor is effectively in a series configuration in the electrical path through the trace to the probe 904. Regardless, such electronic circuit elements (not shown) can be formed using any of the techniques discussed above for forming the traces 302. For example, the material or materials that form a resistor can be an ink material or material in which is suspended electrically conductive particles having a desired electrical conductivity (or electrical resistance). Such an ink material can be deposited by the dispenser 304 while in a liquid, viscous, or aerosol state, and can then be dried after being deposited.

As another example, step 112, among others, of the process 100 of FIG. 1 can be optional, and thus a jumper 900 need not be made or included.

Figure 11:
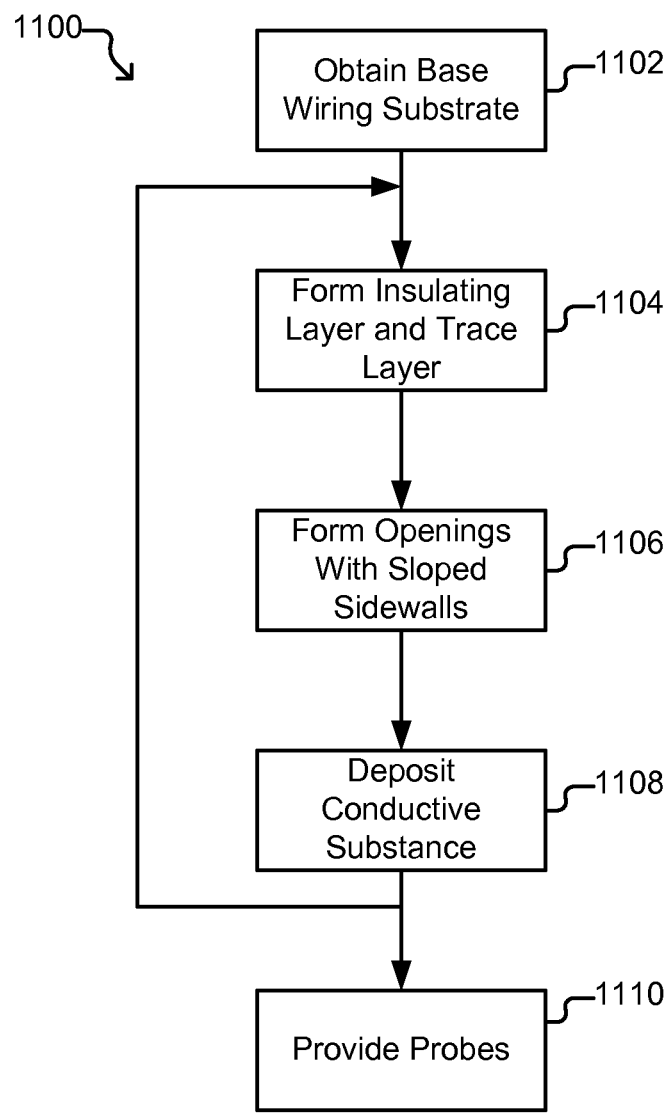
FIG. 11 illustrates another example of a process for adding customization layers to a base wiring substrate to make a customized, multi-layer circuit substrate according to some embodiments of the invention.

FIG. 11 illustrates another process 1100 for adding one or more customization layers to a base wiring substrate according to some embodiments of the invention. For ease of illustration and discussion, the process 1100 is discussed below with respect to examples illustrated in FIGS. 12-17 in which customization layers are added to the base wiring substrate 202. The process 1100 is not, however, limited to the examples illustrated in FIGS. 12-17.

Figure 12:
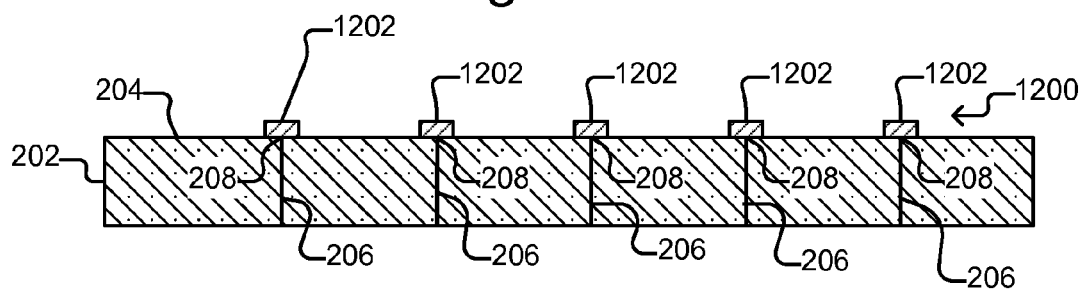
FIG. 12 illustrates an example of a base wiring substrate with a layer of traces according to some embodiments of the invention.

Referring to FIG. 11, step 1102 can comprise obtaining a base wiring substrate, which can be the base wiring substrate 202 as described above with respect to FIG. 2. As illustrated in FIG. 12, the wiring substrate 202 can comprise a trace layer 1200 comprising electrically conductive traces 1202. The wiring substrate 202 can be obtained at step 1102 with the traces 1202 already formed thereon, or the step 1102 can comprise forming the traces 1202 on the surface 204 of the wiring substrate 202. The traces 1202 can be generally the same as and can be made in the same way and of the same material or materials as the traces 302 as discussed above. For example, the traces 1202 can comprise any of the materials identified above as possible materials for the traces 302, and the traces 1202 can be made in any of the ways identified above for making the traces 302. Although five traces 1202 are shown in FIG. 12, there can be more or fewer traces 1202. Moreover, the shapes, sizes, and placement of the traces 1202 in FIG. 12 are examples only, and the traces 1202 can have different shapes and/or sizes and can be placed in a different pattern. The layer 1200 of traces 1202 can be an example of a customization layer (e.g., a first, second, third, etc. customization layer or a first, second, third, etc. trace layer).

Figure 13:
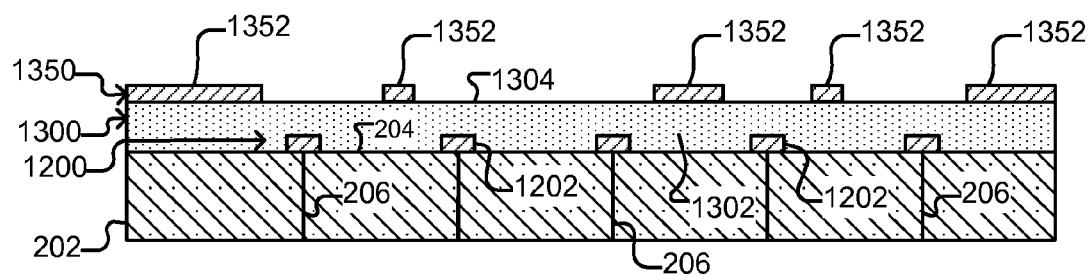
FIG. 13 illustrates another layer of traces on a layer of insulating material on the traces of FIG. 12 according to some embodiments of the invention.

Referring again to the process 1100 of FIG. 11, customization layers comprising an insulating layer and a trace layer can be formed on the wiring substrate at 1104. FIG. 13 illustrates an example in which an insulating layer 1300 of electrically insulating material 1302 and a trace layer 1350 comprising a plurality of electrically conductive traces 1352 can be formed on the wiring substrate 202. The layer 1350 of traces 1352 can be an example of a customization layer (e.g., a first, second, third, etc. customization layer or a first, second, third, etc. trace layer), and the insulating layer 1300 can be an example of a customization layer (e.g., a first, second, third, etc. customization layer or a first, second, third, etc. insulating layer).

The insulating material 1302 can comprise an adhesive film (e.g., an epoxy film such as a B stage epoxy film) that has some but limited viscosity. The insulating material 1302 in the form of such an adhesive film can be disposed on the surface 204 of the wiring substrate 202 and on the traces 1202. A sheet of conductive material (e.g., a metal such as gold, silver, copper, or the like) can be disposed on an outer surface 1304 of the insulating material 1302 (in the form of the adhesive film), and sufficient and generally uniform pressure can be applied to the sheet of conductive material to cause the insulating material 1302 (in the form of the adhesive film) to flow around the traces 1202. The insulating material 1302 (in the form of the adhesive film) can be cured or otherwise set such that the insulating material 1302 adheres to both the surface 204 of the wiring substrate 202 and the sheet of conductive material that is on the outer surface 1304 of the insulating material 1302. In some embodiments, the insulating material 1302 can be heated to a softening point before or shortly after being disposed on the surface 204 of the wiring substrate 202, and the insulating material 1302 can thereafter be cured by allowing the insulating material 1302 to cool to ambient temperature.

Regardless, after the insulating material 1302 is cured, the sheet of conductive material on the surface 1304 of the insulating material 1302 can be patterned to form the traces 1352. For example, portions of the sheet of conductive material can be selectively removed, leaving the traces 1352. In some embodiments, portions of the sheet of conductive material can be loosened (e.g., with a laser) from the insulating material 1302 and then removed from the insulating material 1302 (e.g., by applying a force to the loosened portions using air blasts, a grasping tool, or the like). Alternatively, or in addition, portions of the sheet of conductive material adhered to the surface 1304 of the insulating material 1302 can be removed in other ways such as with a milling machine, chemical etching, or the like. Regardless of how formed, the traces 1352 can be disposed in locations on the surface 1304 of the insulating layer 1300 where, as will be seen, via structures 1500 to traces 1202 and probes 1504 (see FIG. 15) or another via structure 1750 to a trace layer 1600 (see FIG. 17) are to be formed.

Alternatively, the insulating layer 1300 can be formed in any of the same ways and of any of the same materials as the insulating layer 600 as discussed above. Similarly, the traces 1352 can be formed in any of the same ways and of any of the same materials as the traces 302 as discussed above. For example, the traces 1352 can comprise any of the materials identified above as possible materials for the traces 302, and the traces 1352 can be made in any of the ways identified above for making the traces 302.

Figure 14:
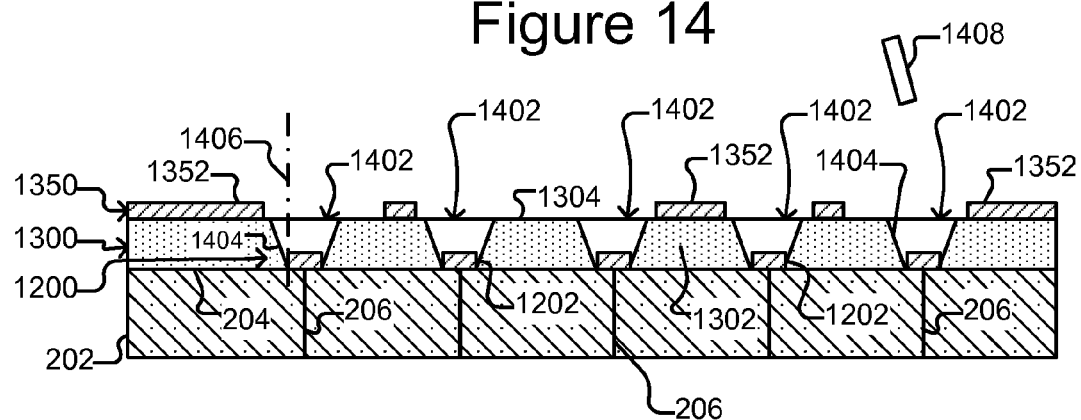
FIG. 14 illustrates openings with at least one sloped side wall in the insulating layer of FIG. 13 according to some embodiments of the invention.
Figure 15:
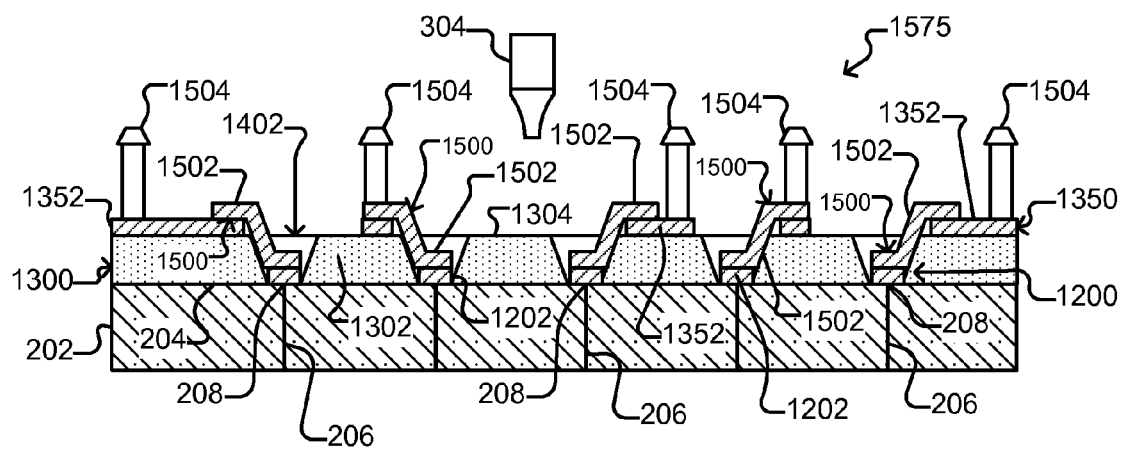
FIG. 15 illustrates via structures formed in the openings of FIG. 14 that can electrically connect the layers of traces according to some embodiments of the invention.

Referring again to the process 1100 of FIG. 11, electrically conductive via structures can be formed electrically connecting ones of the traces (e.g., 1202) with ones of the traces (e.g., 1352) at steps 1106 and 1108. FIGS. 14 and 15 illustrate an example in which electrically conductive via structures 1500 (which can be examples of first, second, etc. via structures) are formed by making openings 1402 through the insulating layer 1300 at step 1106 of the process 1100 of FIG. 11 and then depositing a conductive substance 1502 on a sloped sidewall 1404 of each opening 1402 at step 1108 of FIG. 11.

As shown in FIG. 14, each opening 1402 can be formed adjacent one of the traces 1352 and can extend through the insulating layer 1300 to expose a portion of one of the traces 1202. Each opening 1402 can have a sloped sidewall 1404 adjacent the trace 1352. The sloped sidewall 1404 can be sloped to have an angle with respect to an axis 1406 that is perpendicular to the surface 204 of the wiring substrate 202. In some embodiments, that angle can be at least 15 degrees. In other embodiments, however, that angle can be: at least 10 degrees, at least 20 degrees, at least 30 degrees, or at least 45 degrees. The foregoing numerical angle values are examples only, and the invention is not necessarily limited to any of these numerical angle values.

The openings 1402 can be formed in any manner suitable for forming openings in an insulating material 1302. In some embodiments, a laser 1408 can carve the openings 1402 in the insulating material 1302. In such a case, the traces 1202 can function to prevent the laser 1408 from carving into the wiring substrate 202. Alternatively, other techniques can be used to form the openings 1402 including chemical etching, mechanical cutting, and the like.

As shown in FIG. 15, each via structure 1500 can be formed by depositing an electrically conductive substrate 1502 on a portion of the trace 1202 exposed through an opening 1402, a side wall 1404 of the opening 1402, and a portion of the trace 1352 adjacent the opening 1402. The conductive substance 1502 can be the same material or materials as the traces 302 discussed above and can be deposited in the same way as the traces 302 as discussed above. For example, the conductive substance 1502 can comprise any of the materials identified above as possible materials for the traces 302, and the conductive substance 1502 can be deposited and cured in any of the ways identified above for forming the traces 302. For example, the conductive substance 1502 can comprise an ink in which is suspended particles or nanoparticles of a conductive material (e.g., gold, silver, copper, or the like); the ink can be deposited through a dispenser 304 (e.g., print head such as an ink jet print head or an aerosol jetting mechanism); and then dried or otherwise cured or hardened. Regardless of how made, each via structure 1500 can electrically connect one of the traces 1202 of trace layer 1200 with one of the traces 1352 of trace layer 1350. In some embodiments, and as an alternative to the examples discussed above and illustrated in the figures, the traces 1352 can be formed after the openings 1402 are formed, and the traces 1352 can be formed at the same time, of the same materials, and in the same way as the via structures 1500 and can be extensions of the via structures 1500 on the surface 1304 of the insulating layer 1300.

Figure 16:
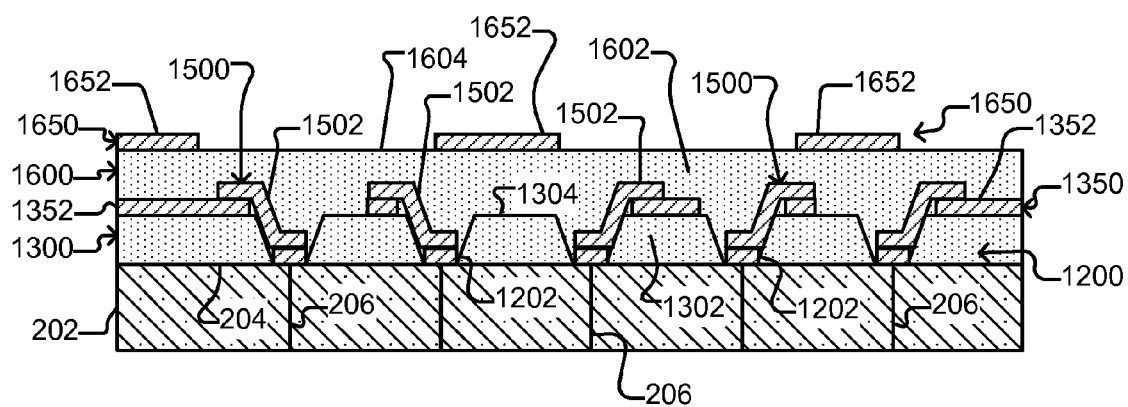
FIG. 16 illustrates yet another layer of traces on another layer of insulating material according to some embodiments of the invention.
Figure 17:
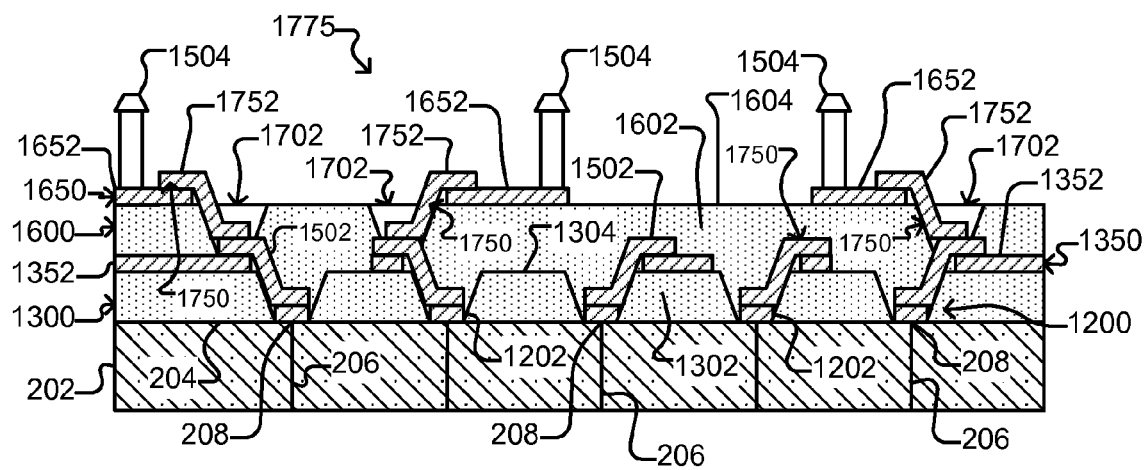
FIG. 17 illustrates via structures formed in openings in the other layer of insulating material of FIG. 16 according to some embodiments of the invention.

Referring again to the process 1100 of FIG. 11, as shown, one or more of steps 1104-1108 can be repeated before providing probes at step 1110. FIGS. 16 and 17 illustrate an example in which steps 1104-1108 can be repeated to form additional customization layers comprising an insulating layer 1600, a layer 1650 of traces 1652 on a surface 1604 of the insulating layer 1600, and via structures 1750. The electrically conductive via structures 1750 (which can be examples of first, second, etc. via structures) in openings 1702 through the insulating layer 1600 can electrically connect ones of the traces 1652 to ones of the traces 1352.

FIG. 16 illustrates an example in which the step 1104 of the process 1100 of FIG. 11 can be repeated and insulating layer 1600 and trace layer 1650 formed on the insulating layer 1300 and trace layer 1350. The trace layer 1650 can be an example of a customization layer (e.g., a first, second, third, etc. customization layer or a first, second, third, etc. trace layer), and the insulating layer 1600 can be an example of a customization layer (e.g., a first, second, third, etc. customization layer or a first, second, third, etc. insulating layer).

The insulating material 1602 of the insulating layer 1600 can comprise an adhesive film (which can comprise the same material as insulating material 1302 as discussed above), which can have some but limited viscosity. The insulating material 1602 (in the form of an adhesive film) can be disposed on the insulating layer 1300 and the trace layer 1350. A sheet of conductive material (e.g., a metal such as gold, silver, copper, or the like) can be disposed on an outer surface 1604 of the insulating material 1602 (in the form of an adhesive film), and sufficient and generally uniform pressure can be applied to the sheet of conductive material to cause the insulating material 1602 (in the form of an adhesive film) to flow generally around the traces 1352 and via structures 1500 and into the openings 1402 in the insulating layer 1300 as generally shown in FIG. 16. Although not shown in FIG. 16, the surface 1604 may not be planar. For example, the surface 1604 may bulge above portions of the via structures 1500 connected to the traces 1352.

The insulating material 1602 (in the form of an adhesive film) can be cured or otherwise set such that the insulating material 1602 (in the form of an adhesive film) adheres to traces 1352, via structures 1500 and insulating layer 1300 as well as the sheet of conductive material on the outer surface 1604 of the insulating material 1602. In some embodiments, the insulating material 1602 (in the form of an adhesive film) can be heated to a softening point before or shortly after being disposed on the traces 1352 and via structures 1500 and into the openings 1402 in the insulating layer 1300, and the insulating material 1602 (in the form of an adhesive film) can thereafter be cured by allowing the insulating material 1602 to cool to ambient temperature.

Regardless, after the insulating material 1602 is cured, the sheet of conductive material adhered to the surface 1604 of the insulating material 1602 can be patterned to form the traces 1652. For example, portions of that sheet of conductive material can be selectively removed, leaving the traces 1652. This can be accomplished—and traces 1652 can thus be formed—in any of the ways discussed above for forming the traces 1352. Regardless of how formed, the traces 1652 can be disposed in locations on the surface 1604 of the insulating layer 1600 where, as will be seen, probes 1504 (see FIG. 17) or another via structure (not shown) to a trace layer (not shown) to be formed above the trace layer 1650 is to be formed.

Alternatively, the insulating layer 1600 can be formed in the same way and of the same materials as the insulating layer 600 as discussed above. Similarly, the traces 1652 can be formed in any of the same ways and of any of the same materials as the traces 302 as discussed above. For example, the traces 1652 can comprise any of the materials identified above as possible materials for the traces 302, and the traces 1652 can be made in any of the ways identified above for making the traces 302.

FIG. 17 illustrates an example in which step 1106 is repeated to form openings 1702 in the insulating layer 1600 and step 1108 is repeated to form via structures 1750 electrically connecting ones of the traces 1652 with ones of the traces 1352 and/or via structures 1500. The openings 1702 can be generally the same as and can be formed in generally the same way as openings 1402 as discussed above with respect to FIG. 14. The via structures 1750 can be generally the same as and can be formed in the generally the same way as the via structures 1500 as discussed above with respect to FIG. 15. Moreover, the via structures 1750 can comprise an electrically conductive substance 1752 which can be the same as and can be deposited and cured or dried in the same way as the conductive substance 1502 as discussed above with respect to FIG. 15. As discussed above with respect to traces 1352, in some embodiments, and as an alternative to the examples discussed above and illustrated in the figures, the traces 1652 can be formed after the openings 1702 are formed, and the traces 1652 can be formed at the same time, of the same materials, and in the same way as the via structures 1750 and can be extensions of the via structures 1750 on the surface 1604 of the insulating layer 1600.

Referring to the process 1100 of FIG. 11 again, after the steps 1102-1108 have been repeated as many times as desired (which can be zero to as many times as needed or desired), at step 1110, electrically conductive contact structures (e.g., probes 1504) can be coupled to and/or formed on one or more of the traces on an outer surface of the customization layers. FIG. 15 illustrates an example in which the steps 1102-1108 are performed one time and the step 1110 is performed to couple probes 1504 to one or more of the traces 1352. FIG. 16 illustrates an example in which the steps 1102-1108 are performed two times and then step 1110 is performed to couple probes 1504 to one or more of the traces 1652.

Regardless of whether coupled to the traces 1352 or to the traces 1652, the probes 1504 can be for making pressure based electrical connections with terminals (not shown) of an electronic device (note shown). In such a case, the probes 1504 can be disposed in a pattern on the traces 1352 or 1652 that corresponds to the terminals (not shown) to be contacted. The probes 1504 can be like any of the probes discussed above for probes 904. Although five probes 1504 are illustrated in FIG. 15 and three probes 1504 in FIG. 16, more or fewer probes 904 can be used. Moreover, the size, shape, and pattern of the probes 1504 in FIGS. 15 and 16 are examples only, and the probes 1504 can be different sizes and/or shapes and/or disposed in different patterns than shown in FIG. 15 or FIG. 16. Although not shown in FIG. 12-17, one or more jumpers like jumper 900 of FIG. 9 can be formed as part of the process 1100 of FIG. 11 to electrically connect traces in any of the trace layers 1200, 1350, and/or 1650 of FIGS. 12-17. Thus, the step 112 of FIG. 1 can also be performed in the process 1100 of FIG. 11.

In some embodiments, the process 1100 of FIG. 11 can produce a multi-layer wiring substrate such as a probe head in which customization layers on a base wiring substrate provide customized electrical connections to custom placed probes. The probe head 1575 of FIG. 15 can be an example of such probe head. The trace layer 1200, the insulating layer 1300, the via structures 1500, and/or the trace layer 1350 can be examples of customization layers that provide electrical connections (combinations of electrically connected traces 1202, via structures 1500, and traces 1352) from the contacts 208 of the base wiring substrate 202 to custom placed probes 1504. It is noted that the probes 1504 can be in a pattern that is different than the pattern of contacts 208 to which the probes 904 are electrically connected.

The probe head 1775 of FIG. 17 can be an example of another such probe head. The trace layer 1200, the insulating layer 1300, the via structures 1500, the trace layer 1350, the insulating layer 1600, the via structures 1750, and/or the trace layer 1650 can be examples of customization layers that provide electrical connections (combinations of electrically connected traces 1202, via structures 1500, traces 1352, via structures 1750, and trace 1652s) from the contacts 208 of the base wiring substrate 202 to custom placed probes 1504. It is noted that the probes 1504 can be in a pattern that is different than the pattern of contacts 208 to which the probes 904 are electrically connected.

As will be seen, probe heads 1575 and 1775 can be examples of probe heads that can be part of a probe card assembly like the probe card assembly 1814 in FIGS. 18 and 19 (which are discussed below). The probe heads 1575 and 1775 of FIGS. 15 and 17 are examples only, and other types of electronic devices can be made using the process 1100 of FIG. 11. For example, step 1110, among other steps, of the process 1100 of FIG. 11 can be optional and need not be performed and/or can be replaced with another step. For example, step 1110 need not be performed, and probes 1504 consequently need not be coupled to any trace or even present. As another example, rather than coupling probes 1504 to the traces at step 1110, another type of electronic structure or structures can be coupled to the traces. For example, electronic circuit elements (not shown) such as resistors, capacitors, transistors, or the like can be coupled to the traces (e.g., traces 1352 or 1652).

As discussed above, the processes 100 and 1100 of FIGS. 1 and 11 illustrate examples of forming on a base wiring substrate customization layers that provide customized electrical connections from vias or other electrical contact structures on or in the base wiring substrate to custom placed electrical elements such as probes. There are many practical applications for such a customized base wiring substrate. FIG. 18 illustrates an example of such an application in which a customized base wiring substrate can be produced by the process 100 of FIG. 1 or the process 1100 of FIG. 11 and then utilized as a component of a probe card assembly 1800. As will be seen, the probe card assembly 1800 can comprise a probe head 1818, which can comprise the base wiring substrate 202 with one or more customization layers 1812 added to the wiring substrate 202 in accordance with the process 100 of FIG. 1 or the process 1100 of FIG. 11.

Figure 18:
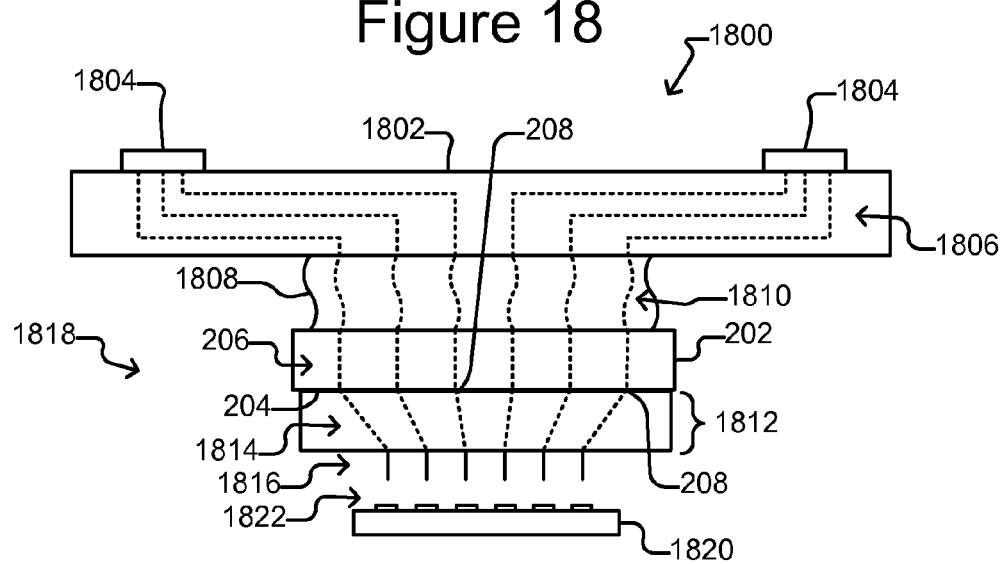
FIG. 18 illustrates an example of a probe card assembly having a probe head comprising a base wiring substrate and customization layers providing electrical connections to custom placed probes on an outer surface of customization layers according to some embodiments of the invention.

FIG. 18 illustrates an example of a probe card assembly 1800 that can be used to test DUT 1820, which can be one or more electronic devices under test such as one or more semiconductor dies (e.g., singulated or unsingulated from the wafer on which the dies were made, packaged or unpackaged) or other electronic devices with input and/or output terminals 1822. As shown in FIG. 18, the probe card assembly 1800 can comprise a wiring substrate 1802, an electrical connector 1808, and a probe head 1818 all of which can be mechanically coupled together (e.g., by clamps, bolts, screws, and/or the like (not shown)). Electrically conductive probes 1816 can be disposed on the probe head 1818 in a pattern that corresponds to at least some of the terminals 1822 of the DUT 1820. The probes 1816 can exhibit primarily elastic behavior when pressed against terminals 1822 of the DUT 1820 to make electrical connections with the terminals 1822. Although six probes 1816 and six terminals 1822 are shown, there can be more or fewer. Moreover, in some embodiments, there can be fewer probes 1816 than terminals 1822, which may thus result in the probes 1816 making multiple touch downs on the terminals 1822 to contact all of the terminals 1822. Custom electrical connections 1814 and vias 206 through the probe head 1818, electrical connections 1810 through the electrical connector 1808, and electrical connections 1806 through the wiring substrate 1802 can electrically connect the probes 1816 to an electrical interface 1804 on the wiring substrate 1802.

Figure 19:
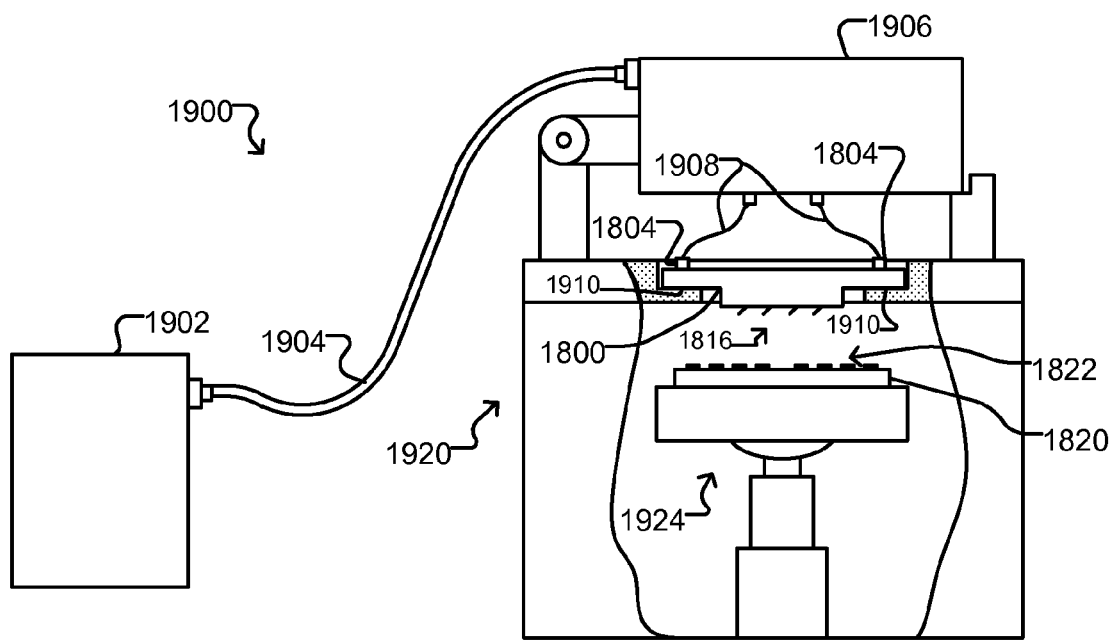
FIG. 19 illustrates an example of a test system in which the probe card assembly of FIG. 18 can be used to test a DUT according to some embodiments of the invention.

The electrical interface 1804 can comprise a plurality of electrical connectors that can be connected to individual communications channels to and from a test controller (not shown) like the test controller 1902 in FIG. 19. For example, the electrical interface 1804 can comprise zero-insertion-force (ZIF) electrical connectors, pogo pin pads, or other such electrical connectors. The wiring substrate 1802 can be a rigid or semi-rigid wiring board such as a printed circuit board or the like. The electrical connections 1806 through the wiring substrate 1802 can be conductive vias and/or traces on and/or in the wiring substrate 1802. The electrical connector 1808 can comprise a plurality of electrical connections 1810 between ones of the electrical connections 1806 and the probe head 1818. The electrical connector 1808 can be any device or collection of electrical connectors suitable for connecting the electrical connections 1806 to the probe head 1818. For example, the electrical connector 1808 can comprise an interposer, wires, solder, or the like.

The probe head 1818 can comprise the base wiring substrate 202 discussed above and one or more customization layers 1812 that provide custom electrical connections 1814 from the contacts 208 on or at the surface 204 of the wiring substrate 202 to custom placed probes 1816. The probes 1816 can be disposed in a pattern that corresponds to a pattern of at least some of the terminals 1822 of the DUT 1820 so that the probes 1816 align with and can thus be brought into contact with at least some of the terminals 1822.

In some embodiments, the customization layers 1812 and probes 1816 can be added to the base wiring substrate 202 using the process 100 of FIG. 1. The probe head 975 can thus be an example of the probe head 1818 in FIG. 18, and the probe head 975 can thus replace the probe head 1818 in FIG. 18. In such a case, the trace layers 300 and 700, the insulating layer 600, the via structures 402, and the jumper 900 in FIG. 9 can be examples of the customization layers 1812 in FIG. 18; the probes 904 in FIG. 9 can be an example of the probes 1816 in FIG. 18; and electrically connected traces 302, via structures 402, jumper 900, and/or traces 702 that electrically connect one of the contacts 208 with one of the probes 904 in FIG. 9 can be examples of the custom electrical connections 1814 in FIG. 18.

Similarly, the probe head 1075 can be another example of the probe head 1818 in FIG. 18, and the probe head 1075 can thus replace the probe head 1818 in FIG. 18. In such a case, the trace layers 300, 700, and 1050; the insulating layers 600 and 1000; the via structures 402 and 1012; and the jumper 900 in FIG. 10 can be an example of the customization layers 1812 in FIG. 18. Likewise, the probes 904 in FIG. 10 can be an example of the probes 1816 in FIG. 18. Electrically connected traces 302, via structures 402, traces 702, jumper 900, via structures 1012, and traces 1052 that electrically connect one of the contacts 208 to one of the probes 904 in FIG. 10 can be examples of the custom electrical connections 1814 in FIG. 18.

Alternatively, in some embodiments, the customization layers 1812 and probes 1816 can be added to the base wiring substrate 202 using the process 1100 of FIG. 11. The probe head 1575 of FIG. 15 can thus be an example of the probe head 1818 in FIG. 18, and the probe head 1575 can thus replace the probe head 1818 in FIG. 18. In such a case, the trace layers 1200 and 1350, the insulating layer 1300, and the via structures 1500 in FIG. 15 can be examples of the customization layers 1812 in FIG. 18; the probes 1504 in FIG. 15 can be an example of the probes 1816 in FIG. 18; and electrically connected traces 1202, via structures 1500, and traces 1532 that electrically connect one of the contacts 208 with one of the probes 1504 in FIG. 15 can be examples of the custom electrical connections 1814 in FIG. 18.

Similarly, the probe head 1775 of FIG. 17 can be another example of the probe head 1818 in FIG. 18, and the probe head 1775 can thus replace the probe head 1818 in FIG. 18. In such a case, the trace layers 1200, 1350, and 1650, the insulating layers 1300 and 1600, and the via structures 1500 and 1750 in FIG. 17 can be an example of the customization layers 1812 in FIG. 18. Likewise, the probes 1504 in FIG. 17 can be an example of the probes 1816 in FIG. 18. Electrically connected traces 1202, via structures 1500, traces 1352, via structures 1750, and traces 1652 that electrically connect one of the contacts 208 to one of the probes 1504 in FIG. 17 can be examples of the custom electrical connections 1814 in FIG. 18.

The probe card assembly 1800 of FIG. 18 can be made as follows. Information regarding the locations of terminals 1822 of the DUT 1820 to be tested can be received. A base wiring substrate 202 with a pattern of contacts 208 that does not necessarily correspond to the locations of the terminals 1822 can be obtained. (Because the contacts 208 need not correspond to the terminals 1822 of the DUT 1820, the base wiring substrate 202 can be obtained prior to receiving the information about the locations of terminals 1822.) In accordance with the process 100 of FIG. 1, the process 1100 of FIG. 11, or a similar process, customization layers 1812 can then be added to the base wiring substrate 202 that provide custom electrical connections 1814 from the contacts 208 of the wiring substrate 202 to probes 1816, which can be disposed in a pattern that aligns the probes 1816 with terminals 1822 of the DUT 1820 in accordance with the information regarding the locations of the terminals 1822. The pattern of the probes 1816 can thus be customized to correspond to the pattern of the terminals 1822 of the DUT 1820.

FIG. 19 illustrates an example of a test system 1900 in which the probe card assembly 1800 can be used to test the DUT 1820 according to some embodiments of the invention. As shown in FIG. 19, the test system 1900 can include a test controller 1902, which can provide input signals to the DUT 1820 and can receive response signals generated by the DUT 1820 in response to the input signals. The term "test signals" can refer generically to either or both the input signals generated by the test controller 1902 and the response signals generated by the DUT 1820. The probe card assembly 1800 can be coupled to a mounting mechanism 1910 of a housing 1920 (e.g., a prober) of the test system 1900. The probes 1816 of the probe card assembly 1800 can make pressure-based electrical connections with terminals 1822 of the DUT 1820, and the test signals can be passed between the test controller 1902 and the DUT 1820 through communication connections 1904 (e.g., a coaxial cable, a wireless link, a fiber optic link, etc.), electronics (not shown) in a test head 1906, electrical connections 1908 between the test head 1906 and the electrical interface 1804, and the probe card assembly 1800.

The DUT 1820 can be tested as follows. The probe card assembly 1800 can be coupled to the mounting mechanism 1910 of the housing 1920, and terminals 1822 of the DUT 1820 can be brought into contact with probes 1816 of the probe card assembly 1800. This can be accomplished by moving the chuck 1924 on which the DUT 1820 is disposed such that terminals 1822 of the DUT 1820 are pressed against probes 1816 of the probe card assembly 1800. Alternatively, the probe card assembly 1800 can be moved, or both the chuck 1924 and the probe card assembly 1800 can be moved to effect contact between the terminals 1822 and the probes 1816.

While the probes 1816 and terminals 1822 are in contact, the DUT 1820 can be tested by providing test signals (which, as discussed above, can include input signals generated by the test controller 1902 and response signals generated by the DUT 1820 in response to the input signals) between the test controller 1902 and the DUT 1820 through the probe card assembly 1800. The test controller 1902 can analyze the response signals to determine whether the DUT 1820 passes the testing. For example, the test controller 1902 can compare the response signals to expected response signals. If the response signals match the expected response signals, the test controller 1902 can determine that the DUT 1820 passed the testing. Otherwise, the test controller 1902 can determine that the DUT 1820 failed the testing. As another example, the test controller 1902 can determine whether the response signals are within acceptable ranges, and if so, can determine that the DUT 1820 passed the testing.

The probe card assembly 1800 of FIG. 18 and the test system 1900 of FIG. 19 are examples only. For example, the probe head 975 of FIG. 9, the probe head 1075 of FIG. 10, the probe head 1675 of FIG. 16, and the probe head 1775 of FIG. 17 can be used in other electronic devices such as a different probe card assembly or test contactor. As another example, the probe card assembly 1800 of FIG. 18 can be used in other test systems.

Although specific embodiments and applications of the invention have been described in this specification, these embodiments and applications are exemplary only, and many variations are possible.

We claim:

1. A multi-layer wiring substrate comprising:
   a base substrate;
   a first layer of electrically conductive traces disposed on a surface of the base substrate;
   a first rigid layer of electrically insulating material disposed on the first layer of traces and coupled to the surface of the base substrate; and
   electrically conductive first vias embedded in the first layer of insulating material, each of the first vias comprising a stack of wire studs or a wire bonded to one of the traces of the first layer of traces and extending to an outer surface of the first layer of insulating material,
   wherein the first layer of insulating material is cast around each said stack of wire studs or each said wire of the first vias, embedding each said stack of wire studs or each said wire of the first vias in the first layer of insulating material.

2. The multi-layer wiring substrate of claim 1, wherein the first layer of insulating material comprises a cured epoxy.

3. The multi-layer wiring substrate of claim 1, wherein the first vias comprise wires bonded to one of the traces of the first layer of traces.

4. The multi-layer wiring substrate of claim 3, wherein a body of each of the wires extends from one of the traces of the first layer of traces substantially vertically with respect to the surface of the base substrate.

5. The multi-layer wiring substrate of claim 3, wherein a body of each of the wires extends from one of the traces of the first layer of traces at an angle between fifteen and seventy-five degrees with respect to the surface of the base substrate.

6. The multi-layer wiring substrate of claim 5 further comprising a second layer of electrically conductive traces on the outer surface of the first layer of insulating material, wherein each of the traces of the second layer of traces is electrically connected to one of the first vias.

7. The multi-layer wiring substrate of claim 6 further comprising:
   a second layer of electrically insulating material disposed on the second layer of traces and the outer surface of the first layer of insulating material; and
   electrically conductive second vias embedded in the second layer of insulating material, each of the second vias comprising a stack of wire studs or a wire bonded to one of the traces of the second layer of traces and extending to an outer surface of the second layer of insulating material,
   wherein second layer of insulating material is cast around each said stack of wire studs or each said wire of the second vias, embedding each said stack of wire studs or each said wire of the second vias in the second layer of insulating material.

8. The multi-layer wiring substrate of claim 7 further comprising a third layer of electrically conductive traces on an outer surface of the second layer of insulating material, the traces of the third layer of traces electrically connected to the second vias.

9. The multi-layer wiring substrate 1, wherein each of the first vias consists only of one said stack of wire studs or one said wire.

10. The multi-layer wiring substrate of claim 1, wherein the first vias each comprise a stack of wire studs bonded to one of the traces of the first layer of traces.

11. The multi-layer wiring substrate of claim 10, wherein each said stack of wire studs comprises at least three wire studs stacked one on top of the other.

12. The multi-layer wiring substrate of claim 1, wherein the first layer of insulating material is a hardened material that was cast in a viscous state around each said stack of wire studs or each said wire of the first vias.

13. The multi-layer wiring substrate of claim 1, wherein the first layer of insulating material comprises silica particles.

14. The multi-layer wiring substrate of claim 13, wherein a concentration of the silica particles in the first layer of insulating material is fifty to ninety percent by weight.

* * * * *